United States Patent [19]
Koide

[11] Patent Number: 5,488,291
[45] Date of Patent: Jan. 30, 1996

[54] OPTICAL CURRENT TRANSFORMER

[75] Inventor: Hidenobu Koide, Kawasaki, Japan

[73] Assignee: Fuji Electric Co., Ltd., Kawasaki, Japan

[21] Appl. No.: 326,584

[22] Filed: Oct. 20, 1994

[30] Foreign Application Priority Data

Oct. 21, 1993 [JP] Japan .................................. 5-262833
Apr. 25, 1994 [JP] Japan .................................. 6-086126

[51] Int. Cl.⁶ ........................ G01R 33/032; G01R 19/00; G02B 6/42
[52] U.S. Cl. ........................ 324/96; 324/117 R; 29/592.1
[58] Field of Search .................................. 324/96, 117 R, 324/127, 753; 359/245, 257; 29/592.1

[56] References Cited

U.S. PATENT DOCUMENTS

| | | | |
|---|---|---|---|
| 4,564,754 | 1/1986 | Sato et al. ................................. | 324/96 |
| 4,745,357 | 5/1988 | Miller ....................................... | 324/96 |
| 5,304,920 | 4/1994 | Stierlin .................................... | 324/96 |

FOREIGN PATENT DOCUMENTS

| | | |
|---|---|---|
| 0088419 | 9/1983 | European Pat. Off. . |
| 0505185 | 9/1992 | European Pat. Off. . |
| 58-153174 | 9/1983 | Japan . |
| 59-659 | 1/1984 | Japan . |
| 59-000659 | 1/1984 | Japan . |
| 59-035156 | 2/1984 | Japan . |
| 59-35156 | 2/1984 | Japan . |
| 62-090546 | 4/1987 | Japan . |
| 63-094167 | 4/1988 | Japan . |
| 01049973 | 2/1989 | Japan . |
| 01053169 | 3/1989 | Japan . |
| 02025761 | 1/1990 | Japan . |
| 02069674 | 3/1990 | Japan . |
| 02232566 | 9/1990 | Japan . |
| 04072576 | 3/1992 | Japan . |

Primary Examiner—Ernest F. Karlsen
Assistant Examiner—Russell M. Kobert
Attorney, Agent, or Firm—Brumbaugh, Graves, Donohue & Raymond

[57] ABSTRACT

An optical current transformer for measuring a current flowing through a conductor by transmitting a light beam about the current-carrying conductor includes four Faraday effect glass rods. For transmitting the light beam, the rods are arranged in a rectangle forming a through hole for the conductor. Three optical path changing pieces are included, each for redirecting the light beam from one of the glass rods to a different one of the glass rods, and each being positioned at a different corner of the glass rod rectangle. Two substrate plates, each having a through hole for the conductor, are positioned at opposite sides of the glass rod rectangle to sandwich the glass rods and the optical path changing pieces therebetween. The glass rods are substantially fixed while allowing for thermal expansion and contraction of the glass rods.

29 Claims, 9 Drawing Sheets

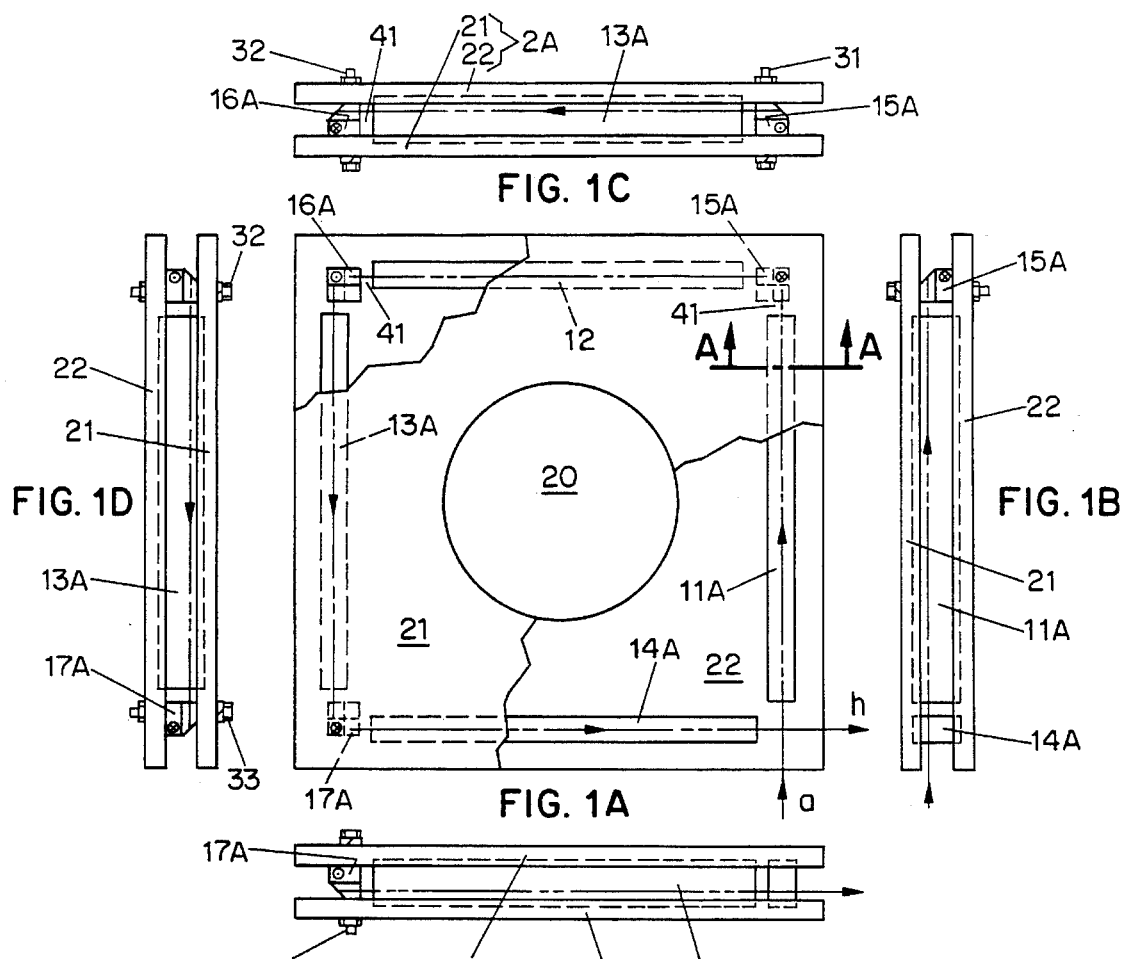
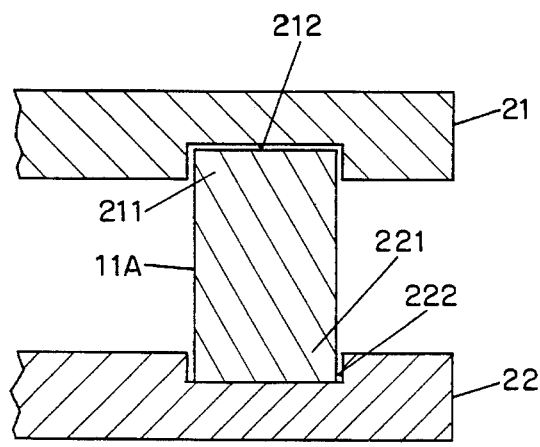

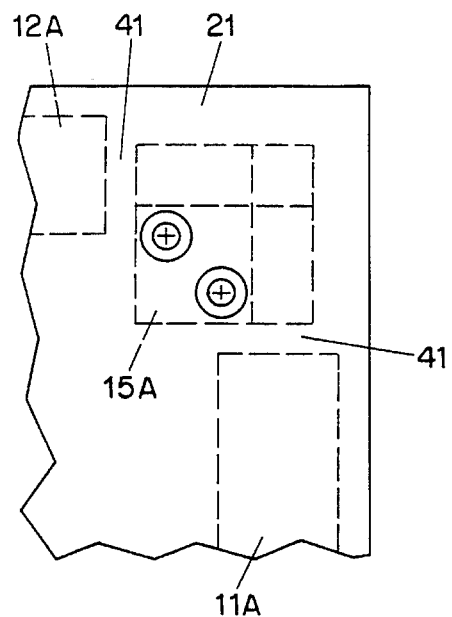
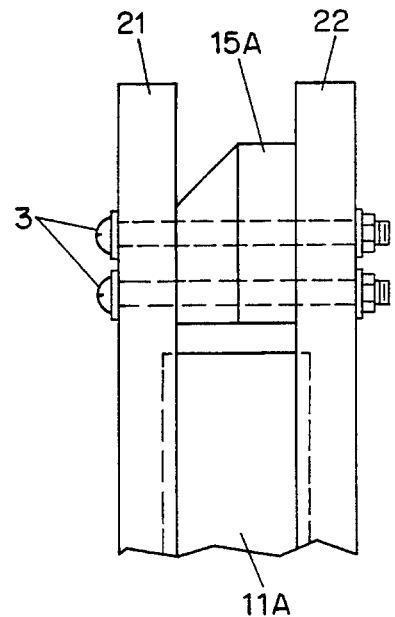
FIG. 3A
FIG. 3B
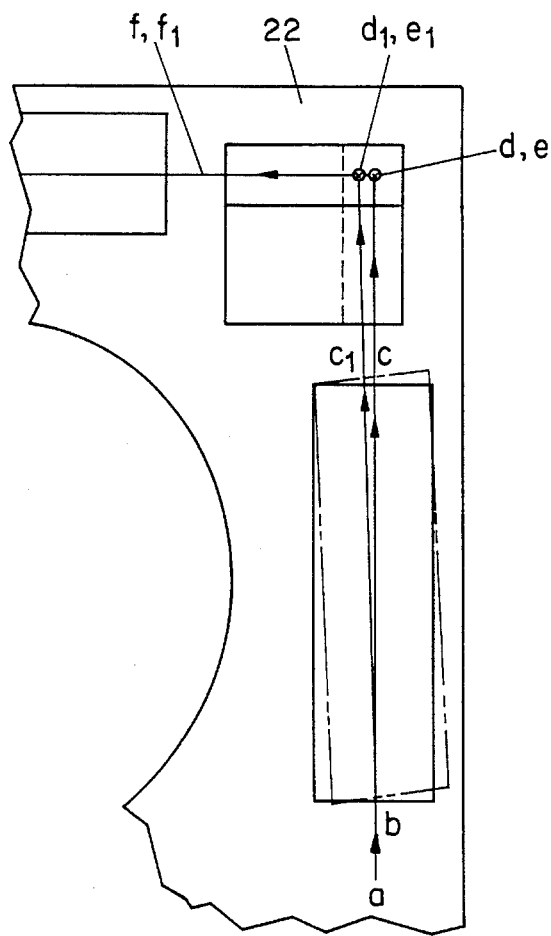
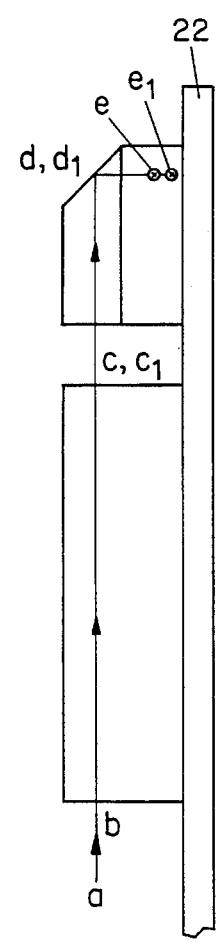
FIG. 4A
FIG. 4B

OPTICAL CURRENT TRANSFORMER

BACKGROUND OF THE INVENTION

1. Field of the Invention

This invention relates to an optical current transformer which is used to measure a relatively large current flowing through a high-voltage conductor such as a gas insulation opening and closing device by utilizing the Faraday effect when the polarization direction of light transmitted through glass under the influence of a magnetic field is rotated.

2. Description of the Related Art

An electric current can be measured by utilizing the rotational phenomenon manifested when polarized light is under the influence of a magnetic field, that is, the Faraday effect. The principle of the Faraday effect is that when polarized light is transmitted through certain types of glass, such as lead glass (hereinafter referred to as Faraday effect glass), which is under the influence of a current-induced magnetic field, the plane of polarization of the light is rotated by $\theta = V \cdot H \cdot L$, where V is Verdet's constant, H is the magnetic field strength in the light travelling direction, and L is the glass length in the light travelling direction. The rotation $\theta$ is detected by a well-known method to measure the magnetic-field strength H, and the current flowing in the Faraday effect glass is calculated on the basis of the magnetic-field strength H.

In many cases, plural conductors are disposed at an ordinary current measuring location. Consequently, measurements are effected by magnetic fields caused by currents of conductors other than the conductor to be measured, which increases the measurement error. A known apparatus for solving the above problem by nullifying the effect of the currents of the conductors other than the target conductor is an optical current transformer in which an optical path surrounding a conductor is set up with Faraday effect glasses disposed about the optical path.

FIGS. 19A–19E are projectional views of a conventional optical current transformer, where FIG. 19A is a plan view, and FIGS. 19B, 19C, 19D and 19E are side views of FIG. 19A which are viewed from the right, upper, left and lower sides, respectively. In these figures, rod-shaped Faraday effect glasses 11, 12, 13 and 14 are arranged in a square form, and optical-path changing pieces 15, 16 and 17 are provided at three of the four corner positions of the square. These elements are fixed to a substrate 2 and to each other by an adhesive agent. A through hole 20 is provided at the center of the substrate 2, and a conductor (not shown) is inserted through the through hole. The two-dotted chain line with an arrow represents an optical path. Incident light beam a is transmitted through Faraday effect glass 11 to optical-path changing piece 15. The beam is totally reflected at a reflection plane at point b which intersects the optical path at a 45° angle, and then totally reflected from another reflection plane at point c, so that the direction of the light beam is changed by 90° upon exiting Faraday effect glass 12. Subsequently, in the same manner as described above, the light is transmitted along the optical path through optical-path changing piece 16, Faraday effect glass 13, optical-path changing piece 17, and Faraday effect glass 14, and is finally emitted from the right side of the Faraday effect glass 14 as emission beam h. Since the beam is transmitted while travelling around a current flowing through a conductor, the emitted beam h is polarized with respect to the incident beam a by a polarization angle which is proportional to the current. The reflection points of the optical-path changing pieces are represented by d, e, f, g, and symbols ⊗ and ⊙ representing a direction perpendicular to the plane of the drawing.

The manner for generating incident beam a leading to emitted beam h are not critical to the present invention, and thus a description and illustration thereof are omitted. In FIGS. 19A–19E, the optical path is illustrated as a square, and thus the Faraday effect glasses 11 to 14 have the same length. This is why the through hole 20 is formed in a circular shape. If the conductor is designed to be a straight-angle conductor and the through hole 20 is designed in a slit shape, the optical path is preferably designed in a non-square rectangular shape. Although the present description is directed to a square optical path, it may be generally applied to a rectangular shape.

In the optical current transformer described above, Faraday effect glasses 11, 12, 13 and 14 and optical-path changing pieces 15, 16 and 17 are fixed to substrate 2 with an adhesive agent. This is because any deviation in the relative positions of these elements will also cause a deviation in the optical path. When this deviation is beyond a permissible range, a light beam converted from incident beam a to emission beam h is not a normal emission beam and the optical current transformer cannot be normally operated. For example, with respect to the optical-path changing piece 15, if reflection points b or c are deviated from the reflection surface, the subsequent optical path is disturbed. Accordingly, the firm fixation of Faraday effect glasses 11, 12, 13, 14 and optical-path changing pieces 15, 16, 17 with an adhesive agent is required to prevent any positional deviation.

An epoxy resin or the like is generally used as the adhesive agent. Such an adhesive agent is an organic material having a coefficient of thermal expansion much different from that of the inorganic glass material used to form Faraday effect glasses 11, 12, 13, 14 and optical-path changing pieces 15, 16, 17. Accordingly, it has been determined that the following problems occur due to temperature variation:

1) Each of the optical-path changing pieces 15, 16, 17 is constructed by adhesively attaching two rectangular prisms to the transformer structure with an adhesive agent. Due to the different thermal expansion coefficients of the optical-path changing pieces and the adhesive agent, the two reflection surfaces cannot be kept perpendicular to each other when any positional deviation occurs between the two rectangular prisms due to temperature variation. Therefore, the state of the light beam, which is varied from a linearly polarized beam to an elliptically polarized beam through a first total reflection plane cannot be completely returned to the linearly polarized state through a second total reflection plane. Hence, the light is kept in the elliptical polarization state and thus an error occurs in the output signal.

2) The light beam is transmitted several times through the adhesive layers that are located between optical-path changing pieces 15, 16, 17 and Faraday effect glasses 11, 12, 13, 14 and between the two rectangular prisms which comprise the optical-path changing pieces 15, 16, 17. The adhesive layers will show anisotropy through repetitive thermal stress which occurs in the layers due to temperature variation, which, in turn, causes a phase shift in the two orthogonal components of the light beam, or light scattering, so that an error occurs in the output signal.

3) Due to the difference in thermal expansion coefficients between the adhesive agent and Faraday effect glasses 11, 12, 13, 14, the phase shift of the two orthogonal components of the light beam occurs in Faraday effect glasses 11, 12, 13, 14 due to so-called photo-elasticity when the temperature varies, so that an error occurs in the output signal.

As described above, these problems magnify the error of the optical current transformer, and thus heighten a possibility that the precision required for the optical current transformer cannot be kept.

SUMMARY OF THE INVENTION

An object of this invention is to solve the above mentioned problems of the prior art, and to provide an optical current transformer in which an error is not magnified and is kept within a predetermined permissible error range even with temperature variation by adopting a construction which does not require adhesion with an adhesive agent.

In order to meet this objective, the present invention provides an optical current transformer for measuring a current flowing through a conductor by transmitting a light beam about the current-carrying conductor. The optical current transformer includes four Faraday effect glass rods, for transmitting the light beam, arranged in a rectangle forming a through hole for the conductor; three optical path changing pieces, each for redirecting the light beam from one of the glass rods to a different one of the glass rods, and each being positioned at a different corner of the glass rod rectangle; two substrate plates, each having a through hole for the conductor, positioned at opposite sides of the glass rod rectangle to sandwich the glass rods and the optical path changing pieces therebetween; and means for substantially fixing the relative positions of the glass rods while allowing for thermal expansion and contraction of the glass rods.

The present invention also provides a method of making an optical current transformer for measuring a current flowing through a conductor by transmitting a light beam about the current-carrying conductor. The method includes the steps of (a) placing three optical path changing pieces on a first substrate having grooves defining a rectangular region, so that the three optical path changing pieces occupy three of four corner locations of the rectangular region of the first substrate, (b) positionally adjusting the three optical path changing pieces, so that an emission beam produced when the transmitting light beam has been transmitted by the three optical path changing pieces is emitted at an angle normal to the plane of the last of the three optical path changing pieces, (c) temporally fixing the three optical path changing pieces to the first substrate; (d) inserting four Faraday effect glasses into the grooves of the first substrate, and (e) securing a second substrate, having grooves defining a rectangular region of similar size to the rectangular region of the first substrate, on an opposite side of the three optical path changing pieces to engage the four Faraday effect glasses in the grooves of the second substrate.

The optical-path changing pieces may be formed from an integral transparent element, with two reflection surfaces for performing total reflection being formed by cutting the element. The optical-path changing pieces may serve as spacers for defining the interval between the two substrates. A predetermined number of bolt holes are provided at predetermined positions on the two substrates and bolts are inserted through the bolt holes. Preferably, a bolt hole which is common to the two substrates is provided to each of the optical-path changing pieces, so that a bolt may be inserted through the substrates and the optical path changing pieces.

In one embodiment, a frame is provided on the peripheral portion of one of the two substrates so as to project to the other substrate. The frame serves as a spacer for defining the interval between the two substrates.

The reflection surfaces of the optical-path changing piece may comprise mirror-surfaces, and may be formed integrally with the substrates. Alternately, the reflection portions are manufactured separately from the substrates, and fixed to the substrates. The reflection portions may comprise non-metal material, with metal films formed on the reflection surfaces thereof. Alternately, the reflection portions may comprise metal material, and the reflection surfaces are mirror-polished.

The optical-path changing pieces are respectively formed of an integral transparent element, and two reflection surfaces for performing total reflection are formed therein by cutting the element. The optical-path changing pieces may be fixed to the transformer through a fixing piece which is fixed to one substrate by bolting. The fixing piece may comprise a fixing portion which is fixed to a base portion of the substrate by bolting, a flat portion which is formed integrally with the fixing portion and on which the optical-path changing piece is mounted, and an L-shaped portion which is formed integrally with the flat portion so as to be disposed erectly and closely contacted with one corner portion of the optical-path changing piece.

Elastic members may be provided between grooves in the substrates and the Faraday effect glasses. The elastic members should be volume-variable, and preferably are inserted into the full area of the face of the Faraday effect glass which is inserted into the groove. Alternatively, the elastic member may be provided at plural local positions on the surfaces of the Faraday effect glasses.

BRIEF DESCRIPTION OF THE DRAWINGS

FIGS. 1A–1E are projectional views showing an optical current transformer according to the first embodiment of the present invention, where FIG. 1A is a plan view, FIG. 1B is a side view of FIG. 1A viewed from the right side, FIG. 1C is a side view of FIG. 1A viewed from the upper side, FIG. 1D is a side view of FIG. 1A viewed from the left side, and FIG. 1E is a side view of FIG. 1A viewed from the lower side.

FIG. 2 is an A—A cross-sectional view of FIG. 1A.

FIGS. 3A and 3B are enlarged partial projectional views of an embodiment of the present invention, where FIG. 3A is a plan view and FIG. 3B is a side view.

FIGS. 4A–4C are enlarged partial projectional views showing the effect on an optical path when the Faraday effect glasses of FIG. 1A are deviated, where FIG. 4A is a plan view, and FIG. 4B and FIG. 4C are side views.

FIG. 12A is a plan view, FIG. 12B is a side view of FIG. 12A viewed from the left side, an FIG. 12C is a side view of FIG. 12A viewed from the lower side.

FIG. 13A is a plan view, FIG. 13B is a side view of FIG. 13A viewed from the left side, and FIG. 13C is a side view of FIG. 13(A) viewed from the lower side.

FIG. 14A is a plan view, FIG. 14B is a side view of FIG. 14A viewed from the left side, and FIG. 14C is a side view of FIG. 14A viewed from the lower side.

FIG. 15A is a plan view, FIG. 15B is a side view of FIG. 15A viewed from the left side, and FIG. 15C is a side view of FIG. 15A

FIG. 18A is a plan view, FIG. 18B is a side view of FIG. 18D viewed from the upper side and FIG. 18C is a side view of FIG. 18A viewed from the right side.

FIG. 19A is a plan view, FIG. 19B, FIG. 19C, FIG. 19D and FIG. 19E are side views of FIG. 19A viewed from the right, upper, left and lower sides, respectively.

DESCRIPTION OF THE PREFERRED EMBODIMENTS

Figure 4C:
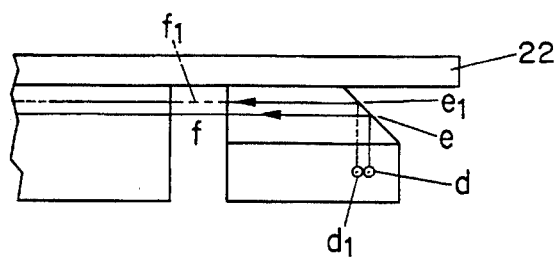

Presently preferred embodiments according to this invention will be described hereunder. FIGS. 1A–1E are projection views of an optical current transformer according to the present invention, where FIG. 1A is a front view, FIG. 1B is a side view viewed from the right side of FIG. 1A, FIG. 1C is a side view viewed from the upper side of FIG. 1A, FIG. 1D is a side view viewed from the left side of FIG. 1A, and FIG. 1E is a side view viewed form the lower side of FIG. 1A. FIGS. 1A–1E are similar to FIGS. 19A–19E, and the same elements are represented by the common reference numerals. Faraday effect glasses 11A, 12A, 13A, 14A and optical-path changing pieces 15A, 16A, 17A are sandwiched between two substrates 21, 22, and are fixed to the substrates by bolt/nut sets 31, 32, 33. However, as described below, Faraday effect glasses 11A, 12A, 13A, and 14A are fixed so as to be movable or are softly fixed by elastic members. Gaps 41 are formed between the optical-path changing pieces 15A, 16A, 17A and the neighboring Faraday effect glasses, and the optical-path changing pieces 15A, 16A, 17A are formed of one type of material. That is, the fixing of the Faraday effect glasses 11A, 12A, 13A, 14A and the optical-path changing pieces 15A, 16A, 17A is performed with no adhesive agent. Accordingly, the problems involved by using an adhesive agent are not applicable. As described below, only the positioning of the optical-path changing pieces 15A, 16a, 17A requires a slight amount of adhesive agent for temporal fastening.

FIG. 2 is a cross-sectional view along a line A—A of FIG. 1A. In this embodiment, substrates 21 and 22 include grooves 211 and 221, and both ends of the Faraday effect glass 11A are inserted into the grooves. There are gaps 212 and 222 between the substrates 21 and 22 and the Faraday effect glass 11A, and Faraday effect glass 11A is displaceable in the gap. As described below, a slight displacement of Faraday effect glass 11A does not disturb the function of the optical current transformer. By not firmly fixing Faraday effect glass 11A, an internal stress can be prevented when the temperature varies.

FIG. 3A is an enlarged partial projectional view of a mount portion of optical-path changing piece 15A corresponding to FIG. 1A. FIG. 3B is a side view of the same mount portion and corresponds to FIG. 1B. In these figures, the bolts of bolt/nut sets 31 are inserted through two bolt holes which are provided in substrates 21 and 22 and the optical-path changing piece 15A, and the bolts are fastened with nuts. The portion of optical-path changing piece 15A where the bolt passes through does not correspond to the optical path, and thus does not affect the optical path. The gap between substrates 21 and 22 is determined on the basis of the thickness of optical-path changing piece 15A. The dimension of the respective elements are predetermined so that gap intervals 212, 222 shown in FIG. 2 are formed between Faraday effect glass 11A and substrates 21 and 22 when the substrates 21, 22 are fixed to each other. It is preferred that the gaps 212, 222 are small, thus the dimensions of the respective elements should be determined by considering manufacturing errors of the respective elements.

In FIG. 3, two bolt/nut sets 31 are provided to fix the optical-path changing piece 15A. However, one bolt/nut set may be used, as shown in FIG. 1.

FIGS. 4A–4C are three partially enlarged projection views showing the optical path when Faraday effect glass is positionally deviated, where FIG. 4A is a plan view, FIG. 4B is a side view corresponding to FIG. 1B, and FIG. 4C is a side view corresponding to FIG. 1C. In the figures, illustration of substrate 21 is omitted and the Faraday effect glass and optical-path changing piece in FIG. 4A are illustrated as being exposed.

A solid line represents Faraday effect glass 11A located at a normal position, and a two-dotted chain line represents Faraday effect glass 11A at a deviated position. In the figure, the deviated Faraday effect glass has been rotated counterclockwise. A solid line having an arrow represents an optical path when the Faraday effect glass 11A is located at the normal position while a two-dotted chain line having an arrow represents an optical path at the deviated position. The path of a transmitted light beam is represented by alphabetic lowercase letters in alphabetic order. Letters without subscripts represent the Faraday effect glass at the normal position, and letters with the subscript "1" represent the Faraday effect glass at the deviated position. In the following description, the Faraday effect glass 11A at the normal position is referred to as a normal glass, and the Faraday effect glass at the deviated position is referred to as a deviated glass.

The point of incidence b of incident light beam a is substantially the same for the normal and deviated glasses. The direction perpendicular to the surface of the normal glass at point b is coincident with the travel direction of incident beam a, and thus no refraction occurs. Therefore, incident beam a and the optical path in the normal glass are on the same straight line. On the other hand, with the deviated glass, the beam is deviated by an angle corresponding to the angle of rotation of the glass, and thus refraction occurs. Therefore, optical path indicated by the two-dotted chain line is deviated to the left from the normal optical path, and the point of emission $C_1$ of the deviated glass is slightly to the left from the point of emission c of the normal glass. The optical path of the emitted light beam from the point of emission $C_1$ is refracted at point $C_1$ to offset the bend of the optical path due to refraction at point b, and thus it is parallel to the emission beam from point c. Consequently, even when Faraday effect glass 11a is rotated, the beam emitted therefrom is parallel to the incident beam. This is why a slight displacement of the Faraday effect glass does not affect the characteristics of the optical current transformer, and non-rigid fixing can be utilized. This variation of the optical path in the deviated glass will now be described in detail.

Since the beam emitted from Faraday effect glass 11A is parallel to the direction perpendicular to the incident surface of optical-path changing piece 15A, no refraction occurs for either the normal glass or the deviated glass upon reflection at reflection point d or $d_1$ and e or $e_1$, or emission from the left side of the optical-path changing piece 15A. Although the reflection points d and $d_1$ and e and $e_1$ are different in position from one another, the respective optical paths incident to Faraday effect glass 12A are kept parallel to each other. Subsequently, although the optical path may be deviated due to any rotation of the remaining Faraday effect glasses, the optical paths are kept parallel to each other. It is therefore possible to obtain a normal emission beam h from the optical current transformer unless the optical path is deviated from the two reflection surfaces of respective optical-path changing pieces. Of course, it is important that a photodetector (not shown) be used to photodetect whether emission beam h is deviated from the normal position.

Figure 5:
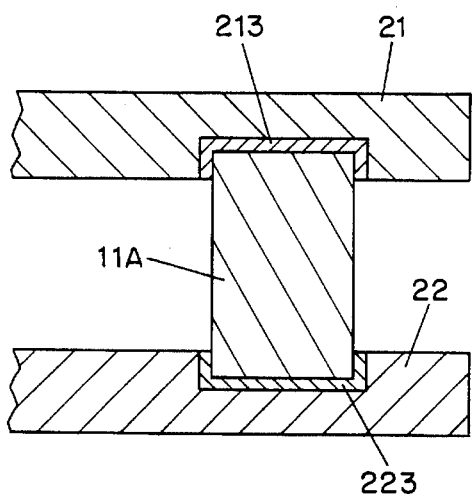
FIG. 5 is an A—A cross-sectional view of FIG. 1A showing a second embodiment of this invention.

FIG. 5 is an A—A cross-sectional view of FIG. 1A, which shows another embodiment of this invention. Sponges 213, 223, which serve as elastic members, are filled into the gaps 212, 222 shown in FIG. 2 between substrates 21, 22 and Faraday effect glass 11A. As explained above, the characteristics of the optical current transformer are not affected by a positional deviation of Faraday effect glasses 11A to 14A. However, if Faraday effect glasses 11A to 14A are designed to be freely movable without restriction as in FIG. 2, they may collide with substrates 21, 22 and become damaged due to movement or vibration of the optical current transformer (although this phenomenon is dependent on the size of the grooves 211, 221). Accordingly, as shown in FIG. 5, sponges 212, 222 are inserted into the optical current transformer to prevent such damage. However, even when dimensional changes occur between Faraday effect glasses 11A to 14A and substrates 21 and 22 due to temperature variation, the sponges 213, 223 can easily absorb the dimensional change, so that no internal stress occurs in Faraday effect glasses 11A to 14A. Further, the use of sponges 213, 223 restricts the possible displacement of Faraday effect glasses 11A to 14A, thereby reducing the variation in the optical path, thus further stabilizing the optical current transformer.

The elastic members filled into gaps 213, 223 of FIG. 5, are preferably made with volume variable material, such as sponges. This is because overstrain is likely to occur if a member with a slightly variable volume, such as a rubber plate is used. In FIG. 5, sponges 212 and 222 are inserted into both gaps between the substrates 21, 22 and the upper and lower sides of the Faraday effect glass 11A; however, a sponge may be inserted into only one gap. Further, the sponges may be inserted over the overall length of the gap, or may only partially fill the gap. At any rate, they should preferably be inserted to such an extent that the Faraday effect glasses are not easily moved.

Figure 6:
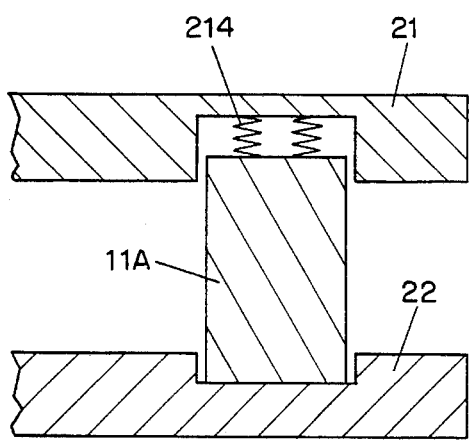
FIG. 6 is an A—A cross-sectional view of FIG. 1A showing a third embodiment according to this invention.

FIG. 6 is an A—A cross-sectional view of FIG. 1A, which shows yet another embodiment of the present invention. In this embodiment, two springs 214 are used as the elastic members. The springs 214 serve to restrict the displacement of Faraday effect glass 11A in an up-and-down direction, and also to restrict the displacement thereof in a right-and-left direction due to friction with the substrate 22. Since it is presently impossible to design the springs 214 to be thinner than the sponges 213, 223, the gap is made larger, as shown in the figure. However, this design is not essential. When such a structure is adopted, rubber may be used in place of the springs 214.

If the elastic member, such as the sponge 213 or spring 214, is provided to only one groove, as in FIG. 6, the other side of Faraday effect glass 11A is in direct contact with the bottom groove, which is advantageous in that the position of Faraday effect glass 11A in the up and down direction is more stabilized.

At any rate, constructions differing from the above constructions may be adopted without departing from the subject matter of this invention insofar as Faraday effect glass 11A is mounted to substrates 21, 22 in a non-rigid manner. The mounting of the remaining Faraday effect glasses 12A to 14A are identical to that of Faraday effect glass 11A.

A method for positioning Faraday effect glasses 11A, 12A, 13A, 14A and optical-path changing pieces 15A, 16A, 17A to fabricate an optical current transformer as shown in FIG. 1 is as follows:

(1) Substrate 22 is disposed horizontally so that groove 221 is face-up, and optical-path changing pieces 15A, 16A, 17A are disposed at temporal positions. In this state, incident beam a is introduced and emission beam h is obtained.

(2) Optical-path changing pieces 15A, 16A, 17A are positionally adjusted so that emission beam h is at the normal position, and the respective optical-path changing pieces are temporarily fixed with a slight amount of adhesive agent after positional adjustment. Since the slight amount of adhesive agent is used, there occurs no problem due to the different in coefficient of thermal expansion as described. In other words, the temporal fixing is performed with such an amount of adhesive agent that no problem occurs.

(3) Elastic members, such as sponges 213, 223 or springs 214 are inserted, and Faraday effect glasses 11A, 12A, 13A and 14A are engagedly inserted into the grooves above the elastic members.

(4) Substrate 21 is then secured. At this time, the elastic members are secured in necessary.

(5) The bolts of the bolt/nut sets 31, 32, 33 are inserted through bolt holes in substrates 21 and 22, and optical-path changing pieces 15A, 16a, 17A, and are fastened by nuts.

Figure 7:
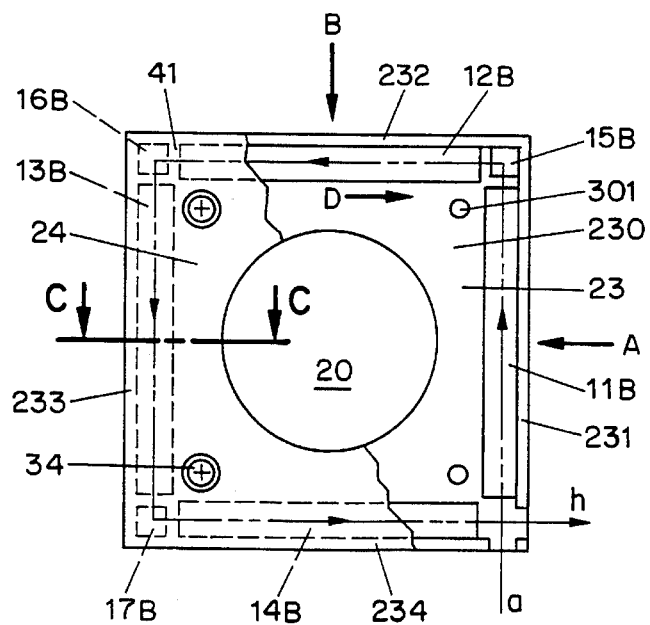
FIG. 7 is a plant view of the optical current transformer of a fourth embodiment of this invention.

FIG. 7 is a plan view of an optical current transformer according to a fourth embodiment of this invention. In this figure, four Faraday effect glasses 11B, 12B, 13B and 14B disposed at the sides of a square are sandwiched between substrates 23, 24. A light beam a emitted from an external light source is incident on Faraday effect glass 11B and transmitted through the respective Faraday effect glasses. The optical path of the beam is bent by optical-path changing pieces 15B, 16B, 17B at the apex portions of the square, whereby the optical path h extending out of the right side of Faraday effect glass 14B is finally obtained. The optical path is represented by a two-dotted chain having an arrow. As described below, the construction of optical-path changing pieces 15B, 16B, 17B is different from that of optical-path changing pieces 15A, 16A, 17A, and also the construction of substrates 23, 24 is different from that of substrates 21, 22. As with substrates 21, 22 of FIG. 1, through hole 20 is formed at the center of substrates 23, 24.

Substrate 23 is located at the lower side and substrate 24 is located at the upper side of Faraday effect glasses 11B–14B. An upper right half portion of substrate 24 is cut out to expose Faraday effect glasses 11B, 12B, 13B, 14B and the optical-path changing piece 15B, as indicated by a solid line. Substrates 23, 24 sandwiching these elements are provided with bolt holes 301, and bolts of bolt/nut sets 34 are inserted through the bolt holes and fastened by nuts, whereby the whole device is mechanically unified into one body.

Substrate 23 includes frames 231, 232, 233, and 234 which project upwards to substrate 24 from the edges of the base portion 230 thereof. These frames are formed integrally with base portion 230, and include a cut out opening for the incident light beam, as shown at the lower right side of FIG. 7. In place of the opening, a through hole having a diameter required for light transmission may be utilized.

Figure 8:
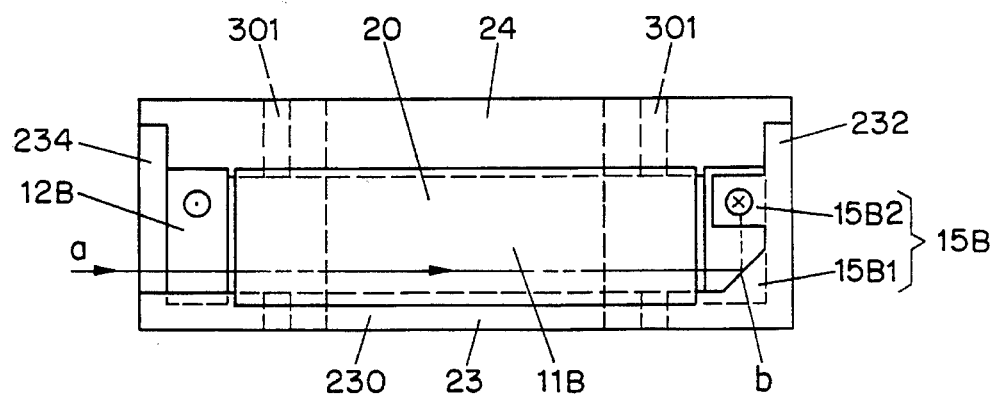
FIG. 8 is side view of FIG. 7 viewed along arrow A.
Figure 9:
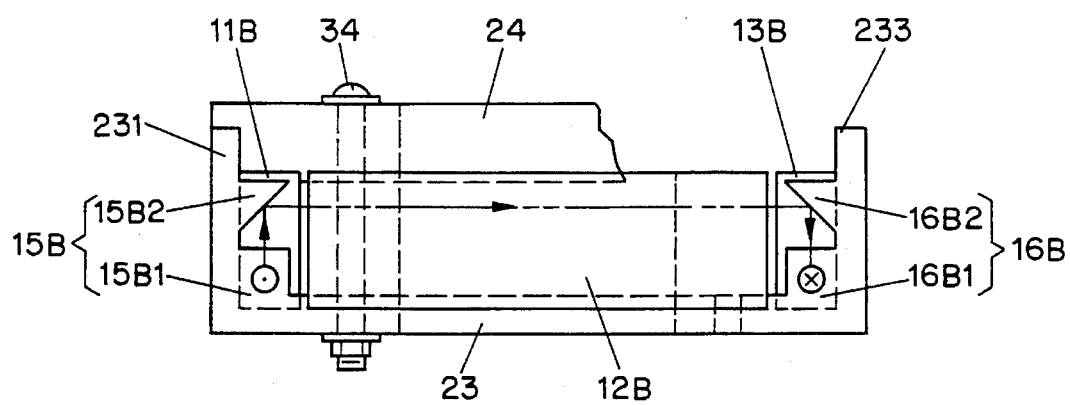
FIG. 9 is a side view of FIG. 7 viewed along arrow B.

FIG. 8 is a side view which is viewed along arrow A when frame 231 of FIG. 7 is removed, and FIG. 9 is a side view which is viewed along arrow B when frame 232 of FIG. 7 is removed. As is apparent from FIGS. 8 and 9, substrate 24 at the upper side in the figure is in contact with the upper portions of the frames 231, 232, 233, 234, which determine its position. The frames 231, 232, 233, 234 serve as spacers for defining the space between the substrates 23, 24.

Figure 11:
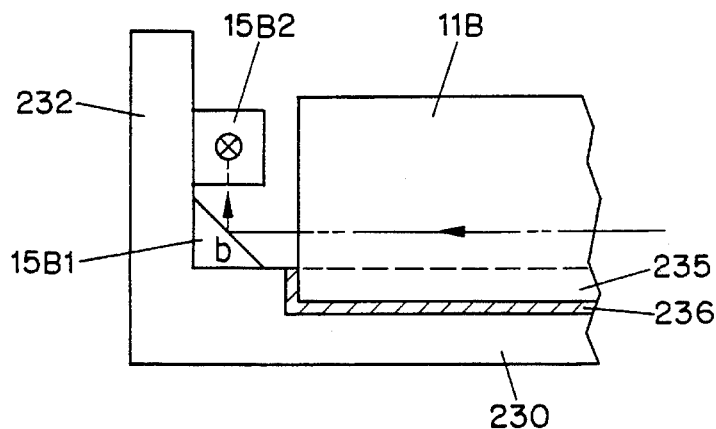
FIG. 11 is a side view of FIG. 7 viewed along arrow D.

As is apparent from FIGS. 8, 9 and 11, each of the optical-path changing pieces 15B, 16B, 17B disposed at the corners of the square comprises two prism-like members projecting inwardly from the frames 231, 232, 233, 234. The prism-like members are formed integrally in the same material as frames 231, 232, 233, 234. As shown in FIG. 8, optical-path changing piece 15B comprises reflection portions 15B1 and 15B2, reflection portion 15B1 includes an isosceles right triangle between frame 232 and base 230, when the slanted surface thereof serves as the reflection surface. Reflection portion 15B2 has the same shape as the reflection portion 15B1, but is facing the back side of the drawing and is illustrated in a square form.

Incident beam a is transmitted through Faraday effect glass 11B, reflected at point b on the reflection surface of reflection portion 15B1 to vary direction from the leftward direction to the upward direction, and reflected at point c on the reflection surface of reflection portion 15B2 to vary direction to travel perpendicular to the drawing surface, as indicated by a direction symbol in the figure. Accordingly, the light beam incident on reflection portion 15B1 changes direction by 90° upon reflection from reflection portion 15B2. Note that optical-path changing piece 15B performs similarly to optical-path changing piece 15A shown in FIG. 1; optical-path changing pieces 16B and 17B perform similarly.

FIGS. 7 to 11 are based on the assumption that the reflection portions are made of metal, and the mirror-polished reflection surfaces of the reflection portions 15B1, 15B2, 16B1, 16B2, 17B1, 17B2 intersect the respective optical paths by 45°.

Figure 10:
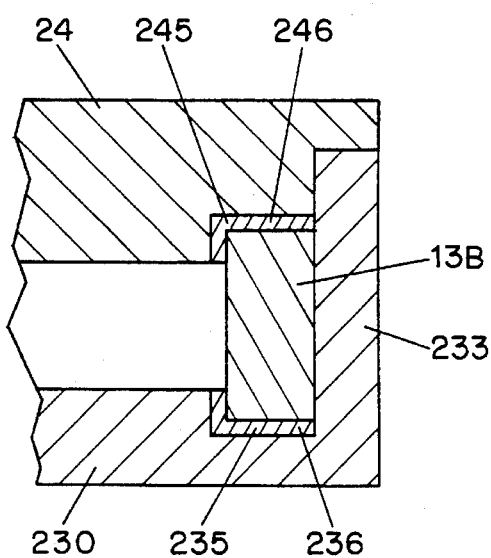
FIG. 10 is a C—C cross-sectional view of FIG. 7.

FIG. 10 is a cross-sectional view of FIG. 7 viewed along the line marked by the letters C, and FIG. 11 is a side view of FIG. 7 viewed from arrow D of FIG. 7. In these figures, Faraday effect glass 13B is inserted into groove 235 of base portion 230 of substrate 23 and into groove 245 of substrate 24, with sponges 236 and 246 serving as elastic members sandwiched therebetween. The width and depth of grooves 235 and 245 are preselected in accordance with the dimension of Faraday effect glass 13B, so that sponges 236 and 246 keep a predetermined thickness. The same effect by using sponges 213, 223 in FIG. 5 is obtained by softly supporting Faraday effect glass 13B with sponges 236 and 246. Springs may be used in place of the sponges as shown in FIG. 6, or the gaps 212, 222 may be without the elastic members such as shown in FIG. 2.

Figure 12B:
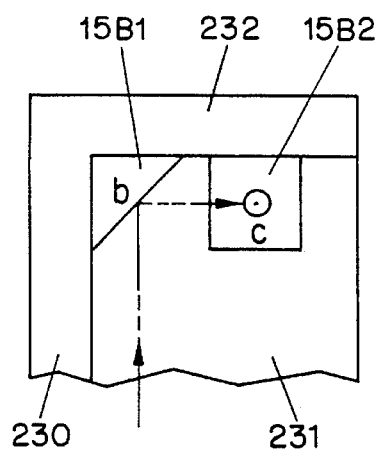
FIGS. 12A–12C enlarged partial projectional views of the optical current transformer according to a fourth embodiment of the present invention, where
Figure 12A:
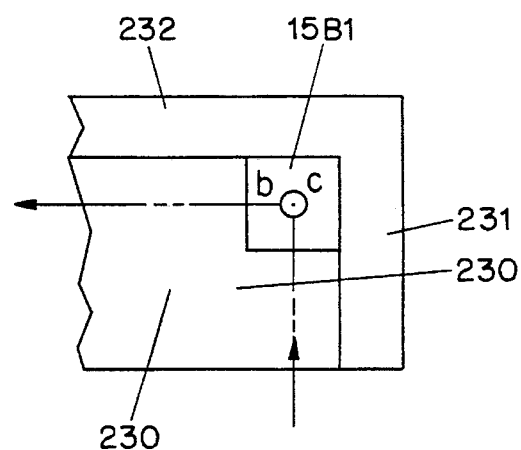
Figure 12C:
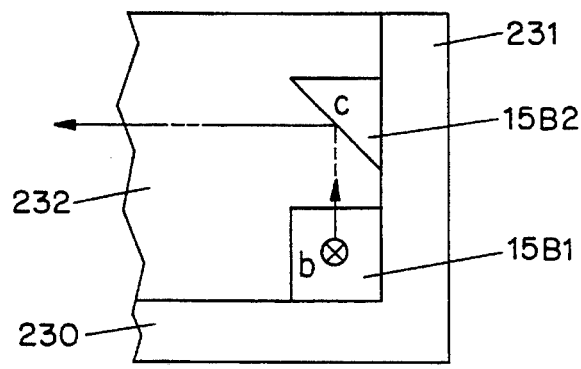

FIGS. 12A–12C are enlarged partial projectional views showing the construction and function of optical-path changing piece 15B, where FIG. 12A is a plan view corresponding to the upper right portion of FIG. 7, FIG. 12B is a side view of FIG. 12A viewed from the left side, and FIG. 12C is a side view of FIG. 12A viewed from the lower side. FIG. 12B is also a view obtained by rotating FIG. 11 clockwise by 90°. The Faraday effect glasses are omitted. The function of optical-path changing piece 15B will now be described in more detail with reference to these figures.

The light beam incident on optical-path changing piece 15B from the lower side of FIGS. 12A and 12B is first reflected at point b on the reflection surface of reflection portion 15B1. The reflection surface intersects the optical path by an angle of 45°, so that the direction of the beam is varied by 90° towards reflection portion 15B2. The reflection surface of reflection portion 15B2 intersects this varied direction of the beam by 45°, so that the travel direction of the beam is again varied by 90° at point c. Therefore, as shown in FIG. 12A, a light beam incident from the lower side is finally directed to the optical-path changing piece 16B (not shown in FIG. 12A). During these reflections, the distance between the optical path and base portion 230 of substrate 23 is varied, as point b is nearer to base portion 230 than is point c. It is apparent from the figures that the elements are set up so that the optical path does not deviate from Faraday effect glasses 11B, 12B, 13B, and 14B, irrespective of this variation in distance between the optical path and base portion 230.

Figure 13B:
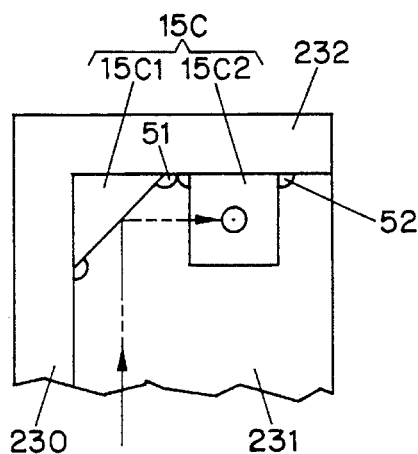
FIGS. 13A–13C are enlarged partial projectional views of the optical current transformer according to a fifth embodiment of the present invention, where
Figure 13A:
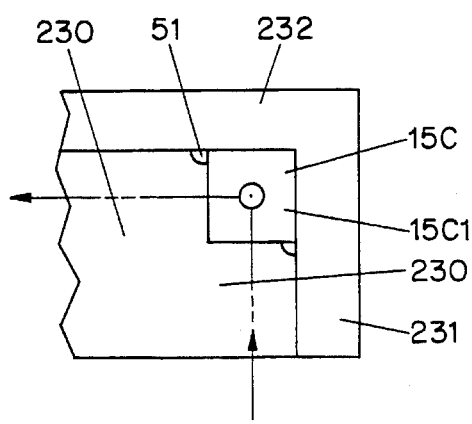
Figure 13C:
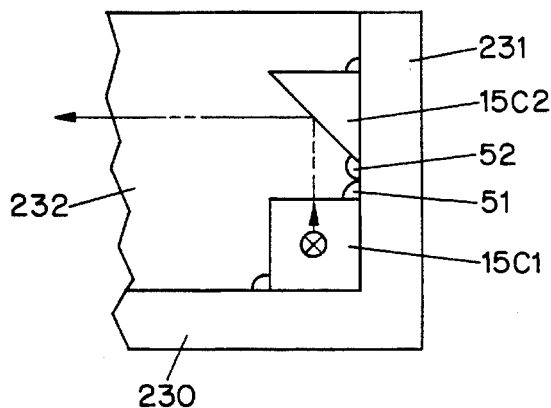

FIGS. 13A–13C are enlarged partial projection views of a fifth embodiment according to this invention. The same elements as in FIGS. 12A–12C are represented by the same reference numerals, and a duplicate description is omitted. The figures are identical to FIGS. 12A–12C except for the construction of optical-path changing piece 15B. In this figure, substrate 23 and optical-path changing piece 15C are made of metal, and reflection portions 15C1 and 15C2 of optical-path changing piece 15C are manufactured separately from substrate 23. These reflection portions are adhesively attached to base portion 230 and frames 231 and 232 by metal deposition, such as welding, to form deposit portions 51 and 52. Substrate 23 and its constituent material are not necessarily identical to the substrate 23 of FIGS. 12A–12C and its constituent material (not shown).

Figure 14B:
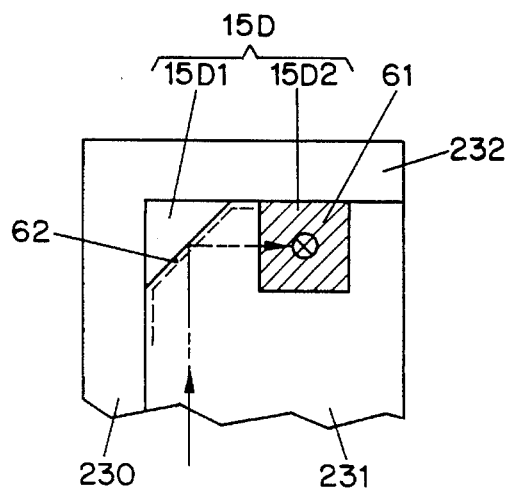
FIGS. 14A–14C are enlarged partial views of the optical current transformer according to a sixth embodiment of the present invention, where
Figure 14A:
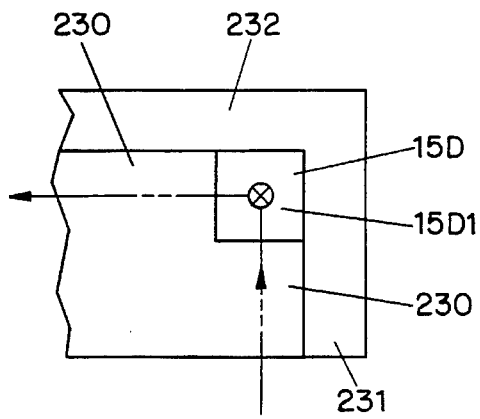
Figure 14C:
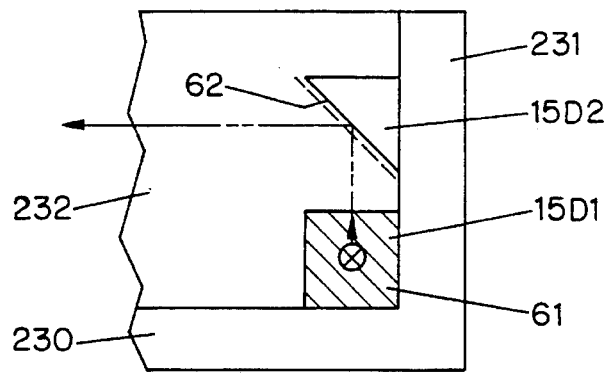

FIGS. 14A–14C are enlarged partial projectional views of a sixth embodiment of this invention. The same elements as in FIGS. 13A–13C are represented by the same reference numerals, and a duplicate description is omitted. The figures are identical to FIGS. 13A–13C except for the construction of the optical-path changing piece. Reflection portions 15D1, 15D2 are formed integrally with the frames 231, 232, of non-metallic material. Metal is deposited on the reflection surfaces to form metal films 61, 62 as indicated by dashed lines and are polished to form mirror surfaces. A metal having a high reflectivity, such as aluminum, silver, or the like may be used to form the metal films.

Figure 15B:
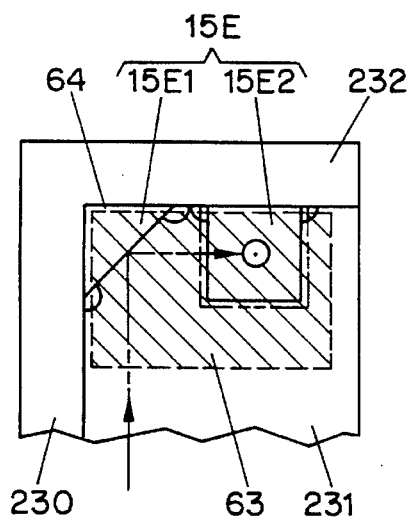
FIGS. 15A–15C are enlarged partial views of the optical current transformer according to a seventh embodiment of the present invention, where
Figure 15A:
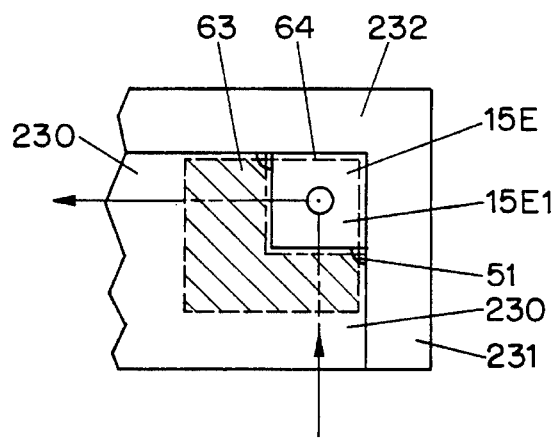
Figure 15C:
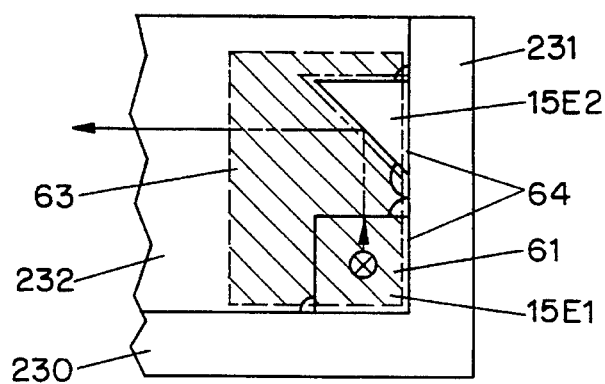

FIGS. 15A–15C are enlarged partial projection views of a seventh embodiment according to this invention. The same elements as in FIGS. 14A–14C are represented by the same reference numerals, and a duplicate description is omitted. The figures are identical to FIGS. 14A–14C except for the construction of the optical-path changing piece. Base portion 230 of substrate 23, frames 231, 232 and reflection portions 15E1, 15E2 are formed of a non-metallic material, such as a ceramic material. Reflection portions 15E1, 15E2 are manufactured separately from base portion 230 and frames 231, 232, which are adhesively fixed to one another. Therefore, as with the reflection surfaces, metal deposition is performed to form metal films 63, 64 and deposit portions 51 and 52, which may be formed by soldering.

As described above, various techniques for forming reflection surfaces of the reflection portions constituting the optical-path changing piece, and for adhesively attaching the substrate and the optical-path changing piece to each other, may be used in accordance with the materials of the substrate and the optical-path changing pieces to be fixed. The composition of the substrate and optical-path changing pieces is selected in consideration of various factors such as workability, relationship of thermal expansion coefficients with respect to the Faraday effect glasses, etc., and the method of forming the reflection surfaces and for adhesion are selected in accordance with the combination of selected materials. Even when the substrate and the optical-path changing piece are formed of the same material, they do not have to be formed integrally with each other. Since the reflection portion of the optical-path changing piece may be separately manufactured and then adhesively fixed to the substrate, the reflection surface forming method and the adhesion method may be selected in accordance with the material used (metal or non-metal).

Since an organic adhesive agent such as an epoxy resin is not used when either the substrate and the optical-path changing piece are formed integrally, or when the optical-path changing piece is adhesively fixed to the substrate, the present invention is not affected by photoelasticity due to a difference in thermal expansion coefficients, and there is no factor which induces deterioration of material with time.

Figure 16:
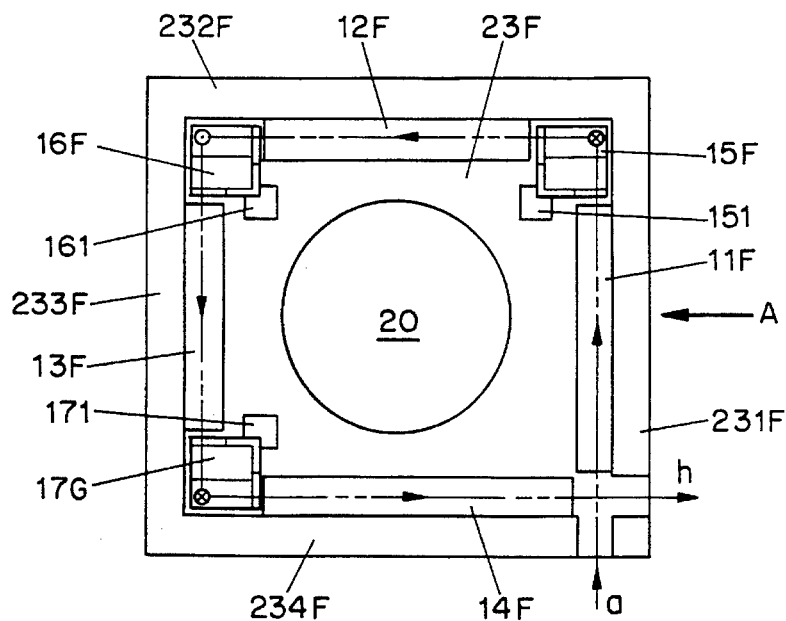
FIG. 16 is a plan view of the optical current viewed from the lower side. transformer according to an eighth embodiment of the present invention.
Figure 17:
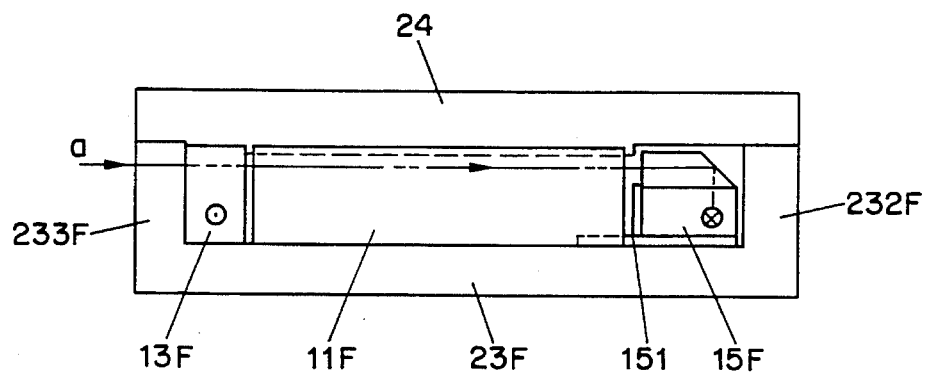
FIG. 17 is a side view of FIG. 16 viewed along arrow A.

FIG. 16 is a plan view of an optical current transformer according to an eighth embodiment of this invention, and FIG. 17 is a side view which is viewed along arrow A of FIG. 16. The same elements in the figures described above are represented by the same reference numerals, and those elements which have the same functions as elements described above are represented by the same numerals with an affix letter F. A duplicate description is omitted. In these figures, three optical-path changing pieces 15F, 16F and 17F are fixed to substrate 23F through fixing pieces 151, 161, and 171. Optical-path changing pieces 15F, 16F, 17F are similar to optical-path changing pieces 15A, 16A, 17A, except that they do not have bolt holes. As described below, optical-path changing pieces 15F, 16F, 17F are adhesively attached to fixing pieces 151, 161, 171 by brazing, and the fixing pieces 151, 161, 171 are fixed to base portion 230 of substrate 23F with bolts. Accordingly, no adhesive agent is required to temporarily secure the optical-path changing pieces 15F, 16F, 17F. Further, even if the optical axis becomes deviated after fabrication, re-adjustment can be performed by loosening the bolts.

The fixing technique illustrated in FIG. 7 is used for the fixing of Faraday effect glasses 11F, 12F, 13F, 14F, and thus a description thereof is omitted. Further, frames 231F, 232F, 233F, and 234F, located on the periphery of substrate 23, are substantially identical to the frames 231, 232, 233, 234 in FIG. 7. Although the frames 231F, 232F, 233F, 234F are illustrated as being thicker than those of FIG. 7, the difference is not important. The bolting shown in FIG. 7 may be used on the substrates 23F and 24F. Further, the substrate 24F and the frames 231F, 232F, 233F, 234F may be fixed to each other through bolts.

Figure 18A:
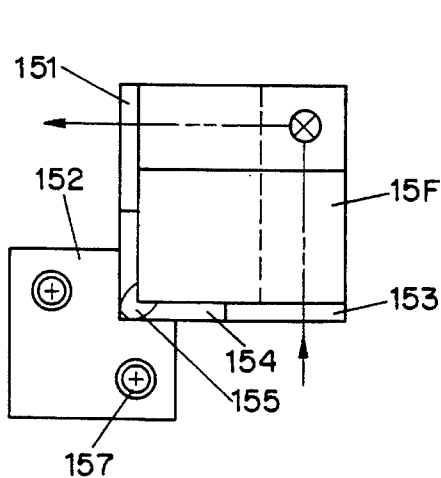
FIGS. 18A–18C are diagrams of the optical-path changing pieces and the fixing pieces of FIG. 17, where
Figure 18C:
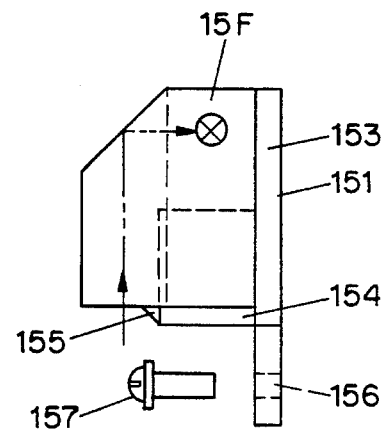
Figure 18B:
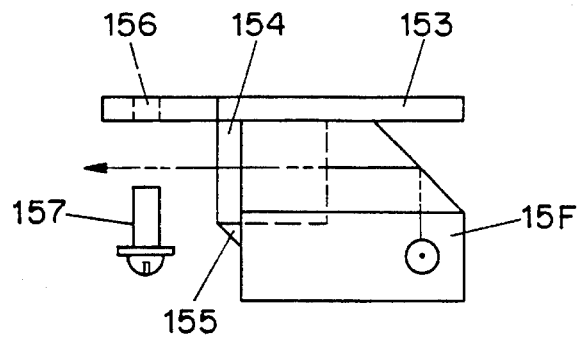
Figure 19C:
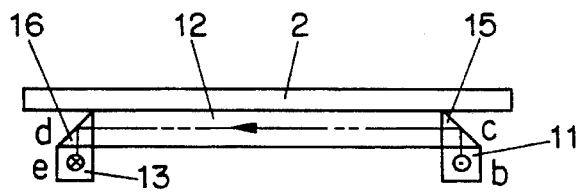
FIGS. 19A–19E are projectional views of a conventional optical transformer, where
Figures 19A, 19B, 19D:
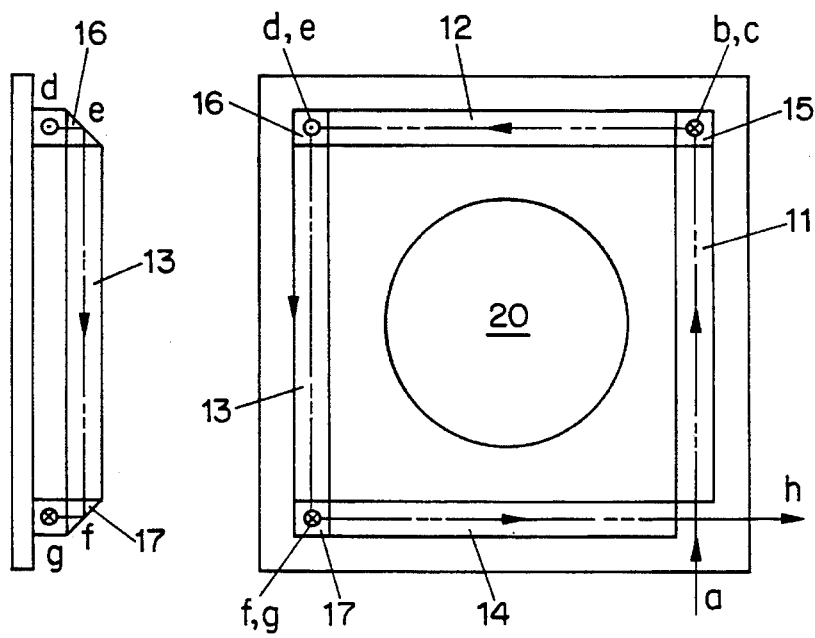
Figure 19E:
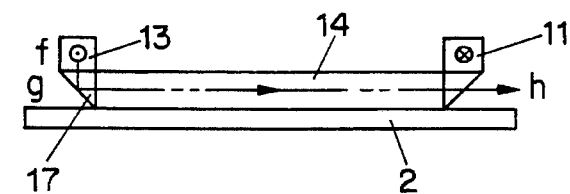

FIGS. 18A–18C are diagrams showing only the optical-path changing piece 15F and the fixing piece 151, where FIG. 18A is a plan view, FIG. 18B is a side view of FIG. 18A viewed from the upper side, and FIG. 18C is a side view of FIG. 18A viewed from the right side. Fixing pieces 161 and 171 are designed to be identical to fixing piece 151. Fixing piece 151 comprises fixing portion 152, including bolt hole 156, which is fixed to base portion 230 of substrate 23F by bolt 157, a flat surface portion 153 which is formed with the same material as the fixing portion and on which optical-path changing piece 15F is mounted, and an L-shaped portion 154 which abuts against one corner of optical-path changing piece 15F to thereby define its position. Fixing piece 151 is made of a ceramic material, and it is fabricated by adhesion, such as a mechanical working or welding. Optical-path changing piece 15F is fixed to L-shaped portion 154 by weld portion 155. A welding method, such as brazing, in which the same material as the fixing piece 151 is melt, may be used for weld portion 155, because only optical-path changing piece 15F and fixing piece 151 are treated at the time of welding. Thus, there is no thermal effect on the other members.

Since the L-shaped portion 154 and flat surface portion 153 are closely attached to the corner portion of the optical-path changing piece 15F, the optical-path changing piece 15F is not rotated, and thus no large stress occurs in the weld portion 155. Therefore, only one weld portion is required.

The construction of fixing piece 151 is not limited to the illustrated shape. For example, L-shaped portion 154 may be omitted, and a weld portion between the flat surface portion 153 and the optical-path changing piece 15F may be provided at two or three positions. Accordingly, the use of an L-shaped portion allows welding at only one position.

The shape of fixing portion 152 is not required to be square, or to partially overlap flat surface portion 153 as shown in the figure. It may be designed in any suitable shape insofar as it does not obstruct Faraday effect glasses 11F and 12F at both sides.

Two bolts 157 are provided for the following reason. When the unified body of the optical-path changing piece 15F and the fixing piece 151 is rotationally shifted after being secured to substrate 23, the body can be prevented from being damaged due to stress concentration by the bolts. If there is no possibility of such stress concentration, only one bolt may be used.

As apparent from FIG. 17, there is a gap between optical-path changing piece 15F and substrate 24F, so that optical-path changing piece 15F is not fastened to substrate 24F.

In the embodiment described above, optical-path changing piece 15F is fixed through fixing piece 151. Therefore, bolt holes are unnecessary and there is no need to fasten the optical-path changing piece to substrates 23, 24. Accordingly, optical-path changing piece 15F does not have to serve as a spacer for defining the interval between the two substrates 23F, 24F. Instead, one substrate may be provided with frames 231F, 232F, 233f, 234F. Alternatively, spacers may be provided at such positions that they does not obstruct the other members, and both substrates may be fastened by bolts which are inserted through bolt holes provided at suitable positions in the substrates. Preferably, in order to prevent dust or water from accumulating on the Faraday effect glasses and the optical-path changing pieces, the space in which these elements are mounted is sealed. Frames 231F, 232F, 233f, 234F and substrates 23F, 24F serve as parts of such a sealing chamber, and a construction as shown in FIG. 7 is superior in practice. Also, although FIG. 16 shows that the frames are cut out at the inlet and outlet beam locations, the incident light a and the emission light h may be connected to external equipment through optical fibers, and thus the space inside frames 231F, 232F, 233F and 234F may be tightly closed by designing an optical fiber securing portion in a sealing structure.

According to the present invention, Faraday effect glasses and optical-path changing pieces are fixed by being sandwiched between the two substrates, and each optical-path changing piece is formed of an integral element, so that adhesion using an adhesive agent is not required. Therefore, no thermal stress occurs due to different thermal expansion coefficients of the Faraday effect glasses and the adhesive agent. Accordingly, an optical current transformer having high precision is obtained.

In one embodiment, the optical-path changing pieces are also used as spacers for defining the interval between the two substrates, the Faraday effect glasses are inserted into grooves provided in the substrates, and the width of the grooves is set to be larger than that of the Faraday effect glasses to thereby form a gap. The gap prevents a clamp force from effecting the Faraday effect glasses, so that no stress occurs in the Faraday effect glasses. In addition, even if the Faraday effect glasses are shifted within the gap, a light beam emitted from the Faraday effect glass will be varied in position only and not in direction. Therefore, the optical path is not substantially deviated, and thus the precision of the optical current transformer is kept high.

When the optical-path changing piece comprises integral transparent material, it is fixed to only one substrate by a fixing piece, which in turn is fixed to the substrate by bolting, so that the other substrate is made irrelevant such fixing. Therefore, the fixing method and construction of the substrates may be selected independently of the optical-path changing piece. Further, the fabrication of the optical-path changing pieces and the fixing pieces can easily be performed at a stage where they are in parts. In addition, the fixing of the optical-path changing pieces to a substrate can be performed independently of the other members, so that the fixing work can be easily performed even after adjustment of the optical path.

Also, by providing frames to one substrate which serve as spacers, the fixing of the two substrates can be performed irrespective of the optical-path changing pieces. A fixing piece preferably includes a fixing portion which is fixed to a base portion of the substrate by bolting, a flat surface portion on which an optical-path changing piece is mounted, and an L-shaped portion which is secured erectly to the flat surface portion so as to be closely attached to one corner of the optical-path changing piece. These elements are formed integrally, so that the displacement of the optical-path changing piece in all directions is restricted by the flat surface and L-shaped portions.

Further, the optical-path changing piece and the fixing piece need to be welded together at only one position. Brazing, using the same material as the fixing piece, is suitable for such welding, and the small number of welding locations both simplifies the welding work and reduces any thermal effect on the elements.

By inserting elastic members into the gaps between the substrate grooves and the Faraday effect glasses, the displacement of the Faraday effect glasses is further restricted within the gaps, thereby preventing damage to the Faraday effect glasses while reducing the variation of the optical path due to displacement of the Faraday effect glasses. By softly supporting the Faraday effect glasses in this manner, there is no possibility that stress due to temperature variation will occur.

Further, if elastic members are inserted throughout the surfaces of the Faraday effect glasses which engage the grooves, and volume-variable material that easily compresses and expands in accordance with the gap interval between the Faraday effect glasses and the substrates is used for the elastic members, soft support can be achieved. Alternatively, the elastic members may be formed of rubber or springs which can be provided at plural local positions on the surfaces of the Faraday effect glasses, to thereby give the Faraday effect glass soft support.

Still further, the two substrates can be fixed to each other by clamping the substrates at suitable positions with a suitable number of bolt/nut sets. In this arrangement, the optical-path changing pieces act as spacers, and soft support can be performed without directly clamping the Faraday effect glasses. Further, bolt holes may be provided to the optical-path changing pieces, with bolts being inserted through the bolt holes and then clamped, so that bend stress is not applied to the substrates but instead is uniformly applied to the optical-path changing pieces. Therefore, stress concentration does not occur, and the optical current transformer is mechanically strong.

Frames can be provided to one substrate so as to project to the other substrate. In such an arrangement, reflection surfaces of the optical-path changing pieces may comprise mirrored surfaces of two reflection portions which are fixed to the frames. Also, the frames may be used as the spacers for defining the interval between the two substrates, so that the optical-path changing substrates are not required to comprise transparent material such as glass. Therefore, the optimum material for the optical-path changing pieces can be selected and the optimum method of fixing the optical-path changing pieces can be achieved.

As a method of fixing the reflection portions to the substrate, the reflection portions may be formed integrally with the substrate on which the reflection portions are fixed, so that no adhesion is required. When the reflection portions are produced separately from the substrates and adhesively attached thereto, metal deposition may be used as the adhesive medium, so that no organic adhesive agent is used. When either or both the substrate and the reflection portion are formed of a non-metallic material, metal may be melted on a welding portion of the non-metallic member, to thereby form a weld portion by metal deposition which fixes the elements.

As a method of forming a reflection surface of the reflection portion made of metal, the surface thereof which is to be the reflection surface is mirror-polished, thereby forming a reflection surface of excellent reflectivity. Further, for a non-metallic reflection portion, metal is deposited therein to form a metal film, whereby a reflection surface also having excellent reflectivity is easily formed.

Further, bolts may be inserted through bolt holes formed in the two substrates, and then clamped with nuts to thereby mechanically unify the substrates and Faraday effect glasses into one body without an adhesive agent.

Finally, since none of all the elements are formed from organic material, the elements do not deteriorate over time, so that the optical current transformer is highly reliable.

I claim:

1. An optical current transformer for measuring a current flowing through a conductor by transmitting a light beam about said current-carrying conductor, comprising:

(a) four Faraday effect glass rods, for transmitting said light beam, arranged in a rectangle to thereby form a through hole for said conductor;

(b) three optical path changing pieces, each for redirecting said light beam from one of said glass rods to a different one of said glass rods, and each being positioned at a different corner of said glass rod rectangle;

(c) two substrate plates, each having a through hole for said conductor, positioned at opposite sides of said glass rod rectangle to sandwich said glass rods and said optical path changing pieces therebetween; and (d) means for substantially fixing the relative positions of said glass rods while allowing for thermal expansion and contraction of said glass rods.

2. The optical current transformer of claim 1, said two substrate plates having aligned bolt holes, further including a plurality of bolt/nut sets, wherein each of said plurality of bolts is inserted through an aligned bolt hole of said two substrate plates and is fixed with a nut.

3. The optical current transformer of claim 2, said three optical path changing pieces having bolt holes, wherein each of said inserted bolts are inserted through one of said sandwiched optical path changing pieces.

4. The optical current transformer of claim 1, said two substrate plates having grooves corresponding to the positions of said glass rod rectangle, wherein:

(a) said four glass rods are inserted into said grooves of said substrate plates; and (b) said fixing means includes means for spacing said substrate plates so that the distance between said grooves of said substrate plates is greater than the thickness of said glass rods, to thereby form a gap between at least one of said substrate plate grooves and said glass rods.

5. The optical current transformer of claim 4, wherein said spacing means comprises a frame connecting said substrate plates at the edges thereof.

6. The optical current transformer of claim 4, further including a plurality of elastic members, wherein said elastic members are positioned in at least one gap between said substrate plate grooves and said glass rods.

7. The optical current transformer of claim 6, wherein said elastic members comprise volume-variable material.

8. The optical current transformer of claim 7, wherein said elastic members comprise sponges.

9. The optical current transformer of claim 7, wherein said elastic members comprise springs.

10. The optical current transformer of claim 6, wherein said elastic members comprise rubber members.

11. The optical current transformer of claim 6, wherein said elastic members are provided at plural local positions within said gaps between said substrate plate grooves and said glass rods.

12. The optical current transformer of claim 1, wherein each of said optical path changing pieces include two reflection surfaces which intersect the path of said light beam at 45 degree angles to thereby redirect said light beam by a 90 degree angle within the plane defined by said glass rod rectangle.

13. The optical current transformer of claim 12, wherein said optical path changing pieces are manufactured separately from said substrate plates, further including means for fixing said optical path changing pieces to at least one of said substrates.

14. The optical current transformer of claim 13, wherein said fixing means include three fixing pieces bolted to one of said two substrates.

15. The optical current transformer of claim 14, wherein each of said fixing pieces comprise:

(a) a fixing portion having at least one bolt hole for bolting to one of said substrates;

(b) a flat surface portion mounted on said fixing portion upon which an optical path changing piece is mounted; and (c) an L-shaped portion, mounted on said flat surface portion, for defining the position of said mounted optical path changing piece.

16. The optical current transformer of claim 13, wherein said optical path changing pieces and said substrate plates comprise metal, and wherein said reflection surfaces are mirror-polished.

17. The optical current transformer of claim 13, wherein:

(a) said optical path changing pieces and said substrate plates comprise a non-metallic substance; and (b) said reflection surfaces comprise metallic films formed on said optical path changing pieces.

18. The optical current transformer of claim 12, wherein said optical path changing pieces are integrally formed with said substrate plates.

19. The optical current transformer of claim 18, wherein said optical path changing pieces and said substrate plates comprise metal, and wherein said reflection surfaces are mirror-polished.

20. The optical current transformer of claim 18, wherein said optical path changing pieces and said substrate plates comprise a non-metallic substance, and wherein said reflection surfaces comprise metallic films formed on said optical path changing pieces.

21. The optical current transformer of claim 1, wherein one of said substrate plates further includes a frame formed about the edge therein, and wherein each of said optical path changing pieces include two reflection surfaces, integrally formed with said frame, which intersect the path of said light beam at 45 degree angles to thereby redirect said light beam by a 90 degree angle within the plane defined by said glass rod rectangle.

22. A method of making an optical current transformer for measuring a current flowing through a conductor by transmitting a light beam about said current-carrying conductor, comprising the steps of:

(a) placing three optical path changing pieces on a first substrate having grooves defining a rectangular region, so that said three optical path changing pieces occupy three of four corner locations of said rectangular region of said first substrate;

(b) positionally adjusting said three optical path changing pieces, so that an emission beam produced when said transmitting light beam has been transmitted by said three optical path changing pieces is emitted at an angle normal to the plane of the last of said three optical path changing pieces;

(c) temporally fixing said three optical path changing pieces to said first substrate;

(d) inserting four Faraday effect glasses into said grooves of said first substrate;

(e) securing a second substrate, having grooves defining a rectangular region of similar size to said rectangular region of said first substrate, on an opposite side of said three optical path changing pieces to thereby engage said four Faraday effect glasses in said grooves of said second substrate.

23. The method of claim 22, wherein said temporal fixing is performed by using a slight amount of an adhesive agent.

24. The method of claim 22, further including the step of inserting, prior to step (d), elastic members into said grooves of said first substrate.

25. The method of claim 22, further including the step of inserting, prior to step (e), elastic members into said grooves of said second substrate.

26. The method of claim 22, said first and second substrates having aligned bolt holes, further including the step of:
(f) inserting bolts through said bolt holes of said first and second substrates and placing nuts on said bolts.

27. The method of 26, said three optical path changing pieces having bolt holes aligned with said bolt holes of said first and second substrates, wherein step (f) includes inserting said bolts through one of said optical path changing pieces.

28. The method of claim 22, wherein step (c) includes brazing said optical path changing pieces to said first substrate.

29. The method of claim 22, wherein step (c) includes welding said optical path changing pieces to said first substrate.

* * * * *

UNITED STATES PATENT AND TRADEMARK OFFICE
CERTIFICATE OF CORRECTION

PATENT NO. : 5,488,291
DATED : January 30, 1996
INVENTOR(S) : Hidenobu Koide

It is certified that error appears in the above-indentified patent and that said Letters Patent is hereby corrected as shown below:

Title page, Item 56, between lines 4 and 5, insert --4,962,990 10/1990 Matsuzawa et al. .... 350/96--;

Column 5, line 1, "an" should read --and--;

Column 5, line 19, "FIG. 15A" should read --FIG. 15A viewed from the lower side.--;

Column 5, bridging lines 20-21, delete "viewed from the lower side."

Signed and Sealed this

Fifth Day of November, 1996

Attest:

BRUCE LEHMAN

Attesting Officer

Commissioner of Patents and Trademarks